(12) United States Patent
Sala et al.

(10) Patent No.: US 10,978,630 B1
(45) Date of Patent: Apr. 13, 2021

(54) SYSTEM FOR CONTROLLING LOCALIZED HEATING AND COOLING

(71) Applicant: GM GLOBAL TECHNOLOGY OPERATIONS LLC, Detroit, MI (US)

(72) Inventors: Dorel M. Sala, Troy, MI (US); Paul W. Alexander, Ypsilanti, MI (US); Nancy L. Johnson, Northville, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 16/589,657

(22) Filed: Oct. 1, 2019

(51) Int. Cl.
| | |
|---|---|
| H01L 35/28 | (2006.01) |
| H01L 35/32 | (2006.01) |
| H01L 35/02 | (2006.01) |
| H01L 35/30 | (2006.01) |
| B62D 1/06 | (2006.01) |
| B60N 2/56 | (2006.01) |

(52) U.S. Cl.
CPC .............. *H01L 35/32* (2013.01); *H01L 35/02* (2013.01); *H01L 35/30* (2013.01); *B60N 2/56* (2013.01); *B62D 1/065* (2013.01)

(58) Field of Classification Search
CPC ........ H01L 35/32; B60H 1/00285; B60N 2/56
See application file for complete search history.

(56) References Cited

U.S. PATENT DOCUMENTS

| | | | | |
|---|---|---|---|---|
| 6,507,328 | B1* | 1/2003 | Lee | G09G 3/22 |
| | | | | 315/169.1 |
| 2005/0161072 | A1* | 7/2005 | Esser | H01L 35/02 |
| | | | | 136/205 |
| 2007/0051400 | A1* | 3/2007 | Aoki | H01L 35/32 |
| | | | | 136/203 |
| 2007/0095378 | A1* | 5/2007 | Ito | H01L 35/32 |
| | | | | 136/203 |
| 2011/0114146 | A1* | 5/2011 | Scullin | H01L 35/34 |
| | | | | 136/205 |
| 2016/0133817 | A1* | 5/2016 | Makansi | H01L 35/32 |
| | | | | 136/212 |
| 2018/0351064 | A1* | 12/2018 | Kozlowski | H01L 35/32 |
| 2019/0109272 | A1* | 4/2019 | Kozlowski | H01L 35/32 |
| 2019/0184869 | A1* | 6/2019 | Galbreath | B60N 2/5678 |
| 2019/0275860 | A1* | 9/2019 | Migneco | B60H 1/00292 |

* cited by examiner

*Primary Examiner* — Angelo Trivisonno

(57) ABSTRACT

A thermal control system includes a component having a surface. A plurality of thermal generating devices include a first conductive plate, second and third conductive plates, a first semiconductor device arranged between the first conductive plate and the second conductive plate, and a second semiconductor device arranged between the first conductive plate and the third conductive plate. The first semiconductor device and the second semiconductor device have different types of doping. First ones of the plurality of thermal generating devices are arranged with the first conductive plate located adjacent to the surface of the component. Second ones of the plurality of thermal generating devices are arranged with the second and third conductive plates located adjacent to the surface of the component. The first ones and the second ones of plurality of thermal generating devices perform heating and cooling of the surface, respectively.

13 Claims, 11 Drawing Sheets

SYSTEM FOR CONTROLLING LOCALIZED HEATING AND COOLING

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to a thermal control system including thermal devices to provide localized heating and/or cooling of a seat pad, seat, steering wheel and/or other component.

Vehicles typically include heating, ventilation and air-conditioning (HVAC) systems to manage the thermal comfort of vehicle occupants. Thermal devices have also been used within seating pads and/or seats for additional occupant comfort. For example, some vehicle seats include heating devices such as resistive heaters and/or cooling devices such as fans.

SUMMARY

A thermal control system includes a component having a surface. A plurality of thermal generating devices include a first conductive plate, second and third conductive plates, a first semiconductor device arranged between the first conductive plate and the second conductive plate, and a second semiconductor device arranged between the first conductive plate and the third conductive plate. The first semiconductor device and the second semiconductor device have different types of doping. First ones of the plurality of thermal generating devices are arranged with the first conductive plate adjacent to the surface of the component. Second ones of the plurality of thermal generating devices are arranged with the second and third conductive plates located adjacent to the surface of the component. The first ones and the second ones of the plurality of thermal generating devices perform heating and cooling of the surface, respectively.

In other features, a plurality of temperature sensors are arranged adjacent to the surface to sense a plurality of temperatures of the component. A controller is configured to selectively operate the plurality of thermal generating devices based on the plurality of temperatures.

In other features, a controller stores a heating and cooling profile defining temperature differences for the plurality of thermal generating devices based on locations of the plurality of thermal generating devices. The controller controls power to the plurality of thermal generating devices based on the heating and cooling profile.

In other features, the first ones of the plurality of thermal generating devices are used to sense a plurality of temperatures, respectively when the first ones of the plurality of thermal generating devices are not heating. The second ones of the plurality of thermal generating devices are used to sense a plurality of temperatures, respectively when the second ones of the plurality of thermal generating devices are not cooling.

In other features, a controller is configured to operate the plurality of thermal generating devices based on the plurality of temperatures. A subset of the plurality of thermal generating devices is arranged in a column. Each of the plurality of thermal generating devices that are arranged within the column are arranged parallel to one another.

In other features, the plurality of thermal generating devices are arranged in a circular arrangement within the at least one of a seat and a seat pad of a vehicle.

In other features, the first ones and the second ones of the plurality of thermal generating devices are disposed between a first foam substrate and a second foam substrate. The first foam substrate defines a plurality of thermoconductive channels. A heat sink is arranged along a surface of the second foam substrate.

A thermal control system includes a plurality of thermal generating device holders. Each of the plurality of thermal generating device holders includes N surfaces where N is an integer greater than one and N slots on each of the N surfaces, respectively. A plurality of thermal generating devices includes a first conductive plate, second and third conductive plates, a first semiconductor device arranged between the first conductive plate and the second conductive plate, and a second semiconductor device arranged between the first conductive plate and the third conductive plate. The first semiconductor device and the second semiconductor device have different types of doping. First ones of the plurality of thermal generating devices are arranged in first ones of the N slots with the first conductive plate facing outwardly. Second ones of the plurality of thermal generating devices are arranged in second ones of the N slots with the second and third conductive plates facing outwardly. The first ones and the second ones of plurality of thermal generating devices perform heating and cooling of the surface, respectively.

In other features, the plurality of thermal generating device holders defines a plurality of cavities, respectively. A string passes through the plurality of cavities of the plurality of thermal generating device holders. The string and the plurality of thermal generating device holders are attached to a vehicle component. The vehicle component is selected from a group consisting of a seat and a steering wheel of a vehicle. The first ones and the second ones of the plurality of thermal generating devices alternate around a periphery of at least one of the plurality of thermal generating device holders. The plurality of thermal generating device holders have a polygonal cross-section.

A thermal control system includes a vehicle component selected from a group consisting of a seat, a seat pad and a steering wheel. The vehicle component includes a surface. A plurality of thermal generating devices includes a first conductive plate, second and third conductive plates, a first semiconductor device arranged between the first conductive plate and the second conductive plate, and a second semiconductor device arranged between the first conductive plate and the third conductive plate. The first semiconductor device and the second semiconductor device have different types of doping. First ones of the plurality of thermal generating devices are arranged with the first conductive plate located adjacent to the surface of the component. Second ones of the plurality of thermal generating devices are arranged with the second and third conductive plates located adjacent to the surface of the component. The first ones and the second ones of plurality of thermal generating devices perform heating and cooling of the surface, respectively. A controller stores a heating and cooling profile defining temperature differences for the plurality of thermal generating devices attached to the component based on locations of the plurality of thermal generating devices. The controller controls power to the plurality of thermal generating devices based on the heating and cooling profile.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

The present disclosure is directed to systems for providing localized heating and/or cooling to a surface of a component such as a seat, seat pad, a steering wheel, etc. In one or more implementations, the component may be located in a vehicle. The component includes one or more thermal generating devices. The thermal generating devices include multiple thermoelectric cooler/heater devices that generate heating and/or cooling via voltage differences applied to the thermoelectric cooler/heater devices. For example, the thermoelectric cooler/heater devices can provide thermoelectric heating or cooling according to the Peltier effect as described in greater detail below.

Figure 1:
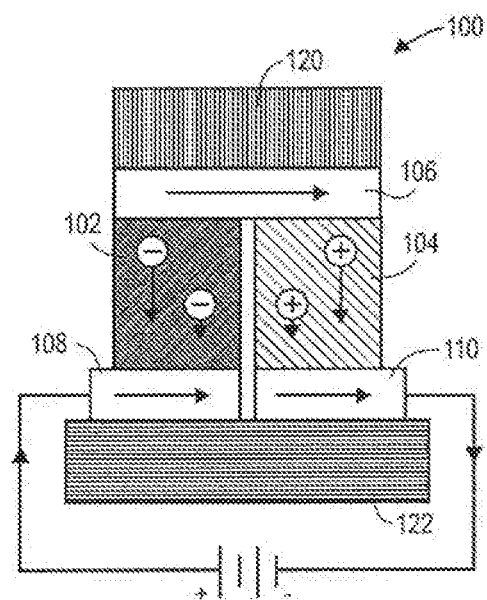
FIG. 1 illustrates an example of a thermoelectric cooler/heater device according to the present disclosure.
Figure 2A:
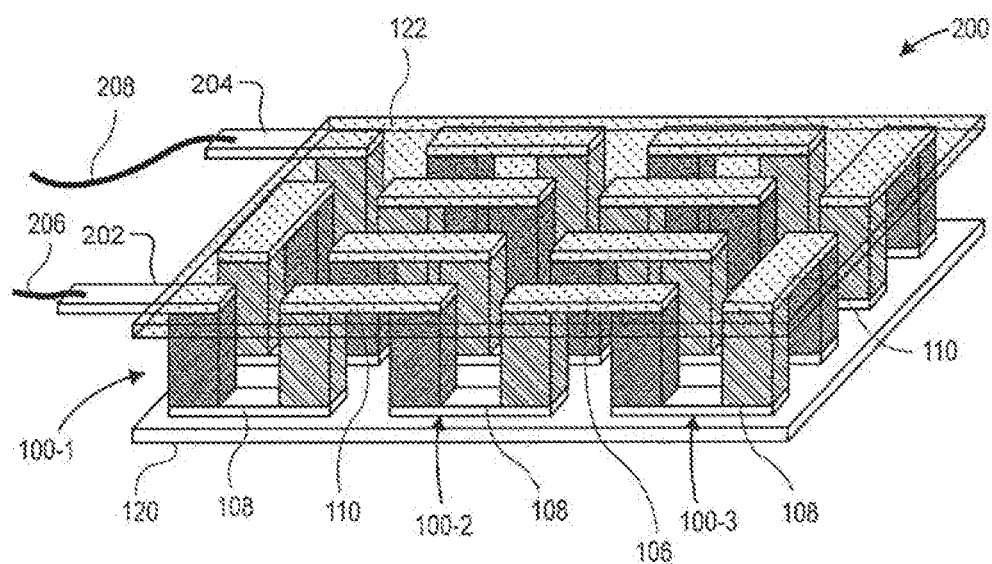
FIG. 2A is a isometric illustration of an example of a thermal generating device including multiple thermoelectric cooler/heater devices according to the present disclosure.
Figure 2B:
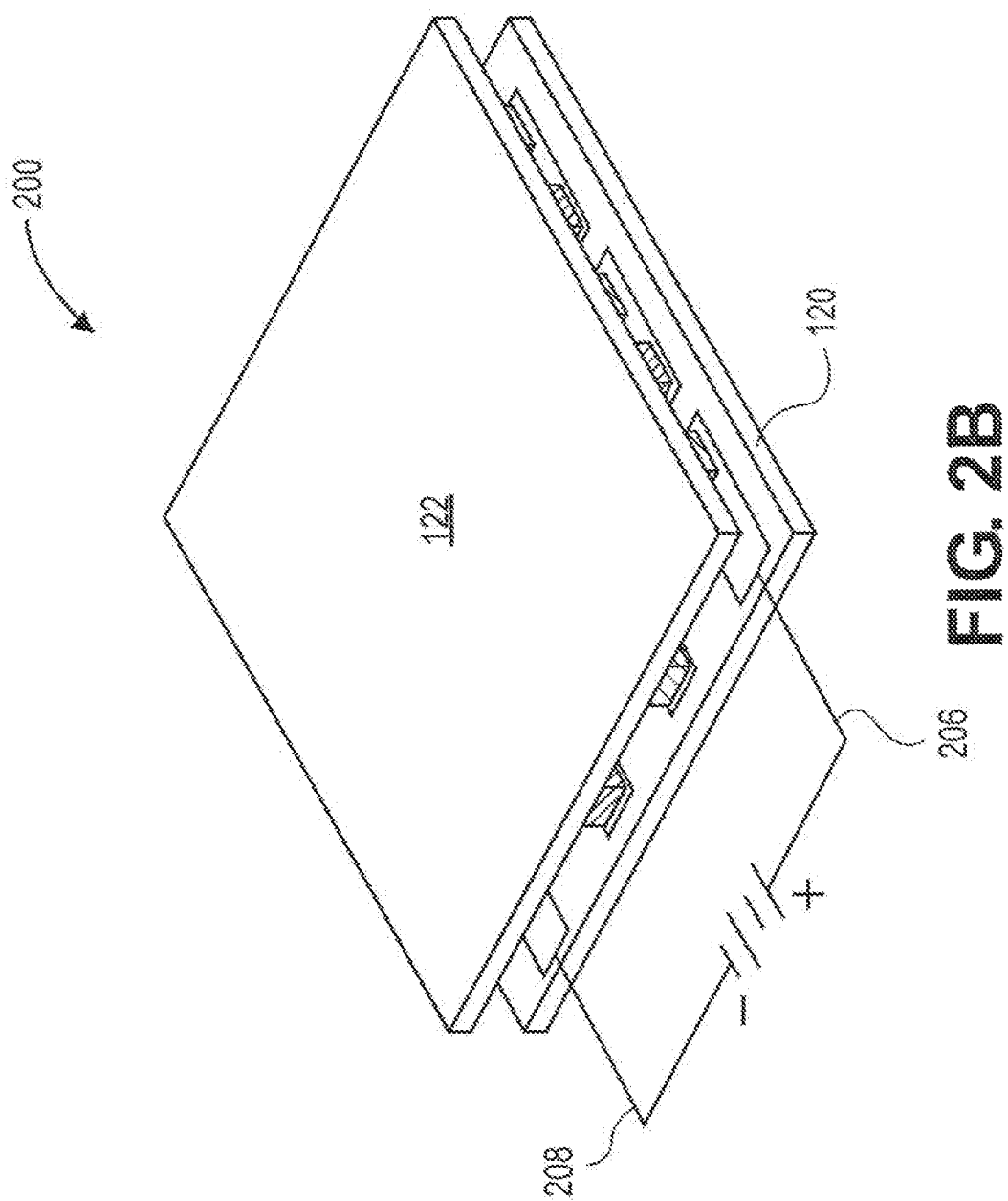
FIG. 2B is another isometric illustration of an example of a thermal generating device including multiple thermoelectric cooler/heater devices according to the present disclosure.

FIG. 1 illustrates an example thermoelectric cooler/heater device 100. As shown, the thermoelectric cooler/heater devices 100-1, 100-2, 100-3, . . . (collectively thermoelectric cooler/heater devices 100) include semiconductor devices 102, 104 having different types of doping. The semiconductor device 102 is an n-doped semiconductor device, and the semiconductor device 104 is a p-doped semiconductor device. Referring to FIGS. 1 and 2A, the semiconductor devices 102, 104 are connected to a first conductive plate 106, a second conductive plate 108, and a third conductive plate 110. A first ceramic structure 120 is disposed over and in contact with the first conductive plate 106. A second ceramic structure 122 is disposed over and in contact with the second and third conductive plates 108, 110.

FIG. 2A illustrates an example thermal generating device 200 including multiple thermoelectric cooler/heater devices 100. For example, the thermal generating device 200 includes a first thermoelectric cooler/heater device 100-1 including semiconductor devices 102, 104, a second thermoelectric cooler/heater device 100-2 including semiconductor devices 102, 104, and a third thermoelectric cooler/heater device 100-3 including semiconductor devices 102, 104.

The first conductive plate 106 is connected to one side of the semiconductor device 102 and to one side of the semiconductor device 104 of thermoelectric cooler/heater device 100-1. The second conductive plate 108 is connected to the opposite side of the semiconductor device 102 and to a corresponding side of the semiconductor device 104. The third conductive plate 110 is connected to the opposite side of the semiconductor device 104 and to a corresponding side of the semiconductor device 102.

A voltage is applied to the thermal generating device 200 via electrodes 202, 204. The electrodes 202, 204 can be connected to a power source, such as a battery, via electrical connections 206, 208. The electrical connections can be wire, traces, or the like. Once the voltage is applied to thermal generating device 200, heat transfers from one side of the thermal generating device 200 to the other due to current flow allowing one side to be relatively cooler.

Figure 3:
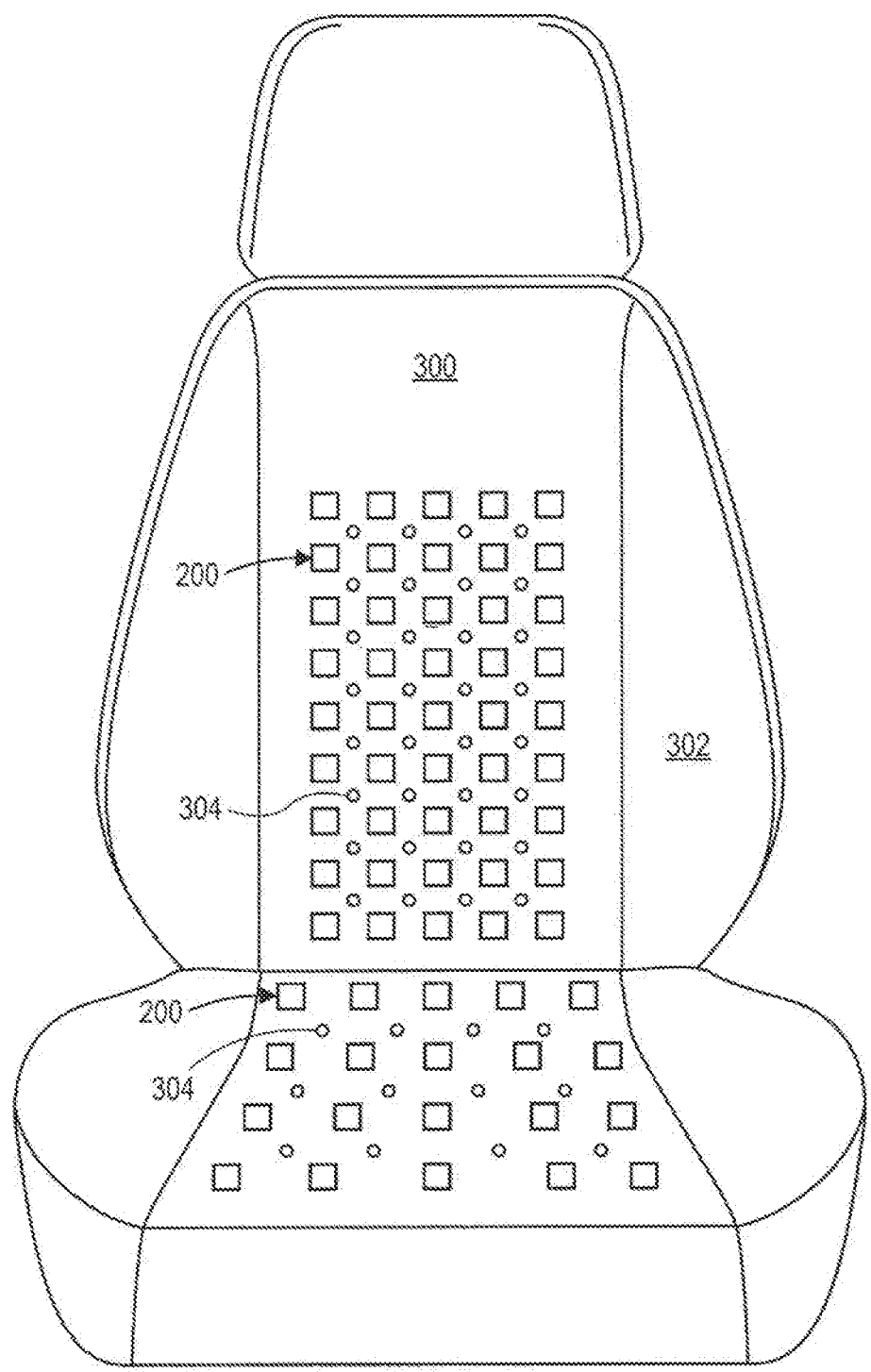
FIG. 3 illustrates an example of a seat pad including multiple thermal generating devices according to the present disclosure.

FIG. 3 illustrates an example seat pad 300. The seat pad 300 can be positioned over a seat 302, such as a vehicle seat. The seat pad 300 includes multiple thermal generating devices 200 that provide localized heating and/or cooling to one or more portions of the seat pad 300. In one or more implementations, the seat pad 300 may be a foam pad having the thermal generating devices 200 integrated therein. The seat pad 300 also includes sensors 304 that can detect environmental parameters proximate to the seat pad 300. For example, the environmental parameters may include, but are not limited to, temperature or humidity. In some examples, the thermoelectric cells that are not activated can be used as temperature sensors. For example, during cooling, the thermoelectric cells that are used for heating are not activated and can be used to generate a voltage proportional to a temperature difference between the sides of the corresponding thermoelectric cell (and vice versa during heating).

Figure 4:
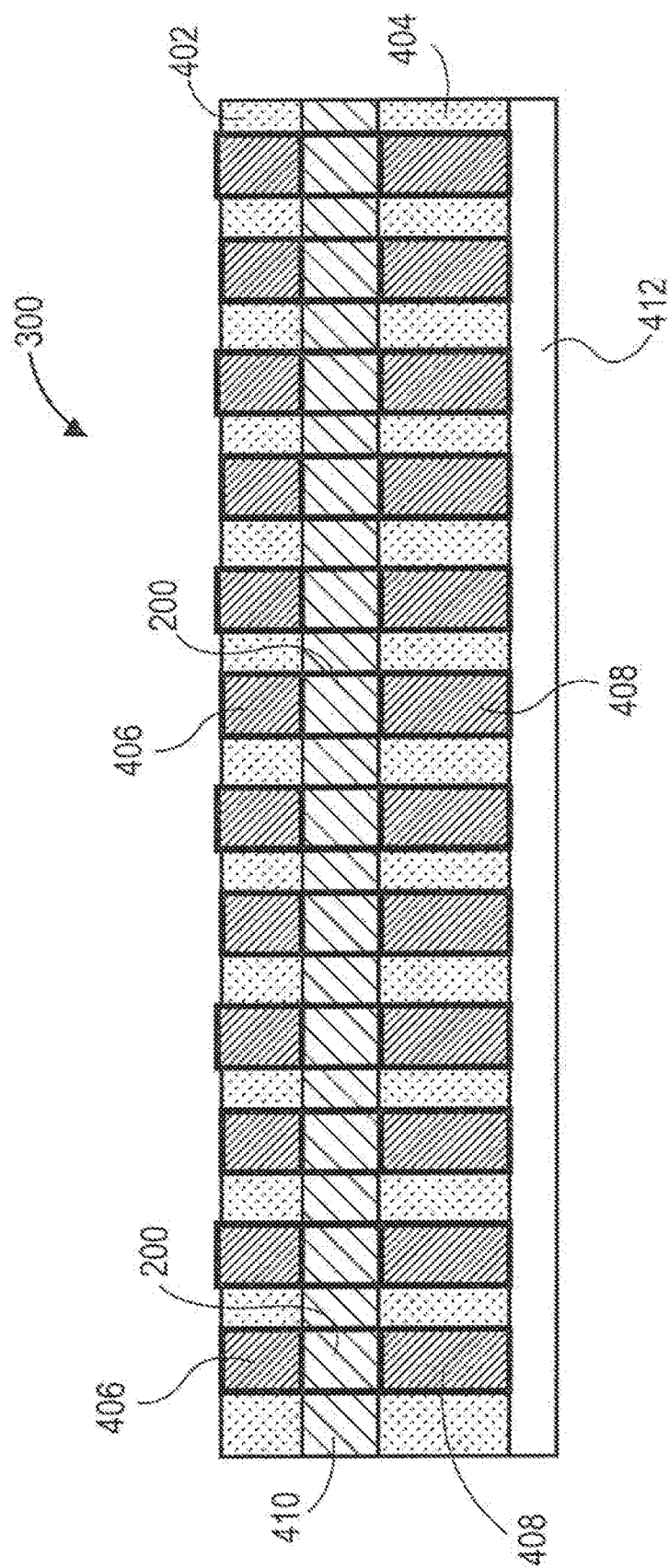
FIG. 4 is a cross-sectional view an example of multiple thermal generating devices disposed in one or more foam substrates according to the present disclosure.

FIG. 4 illustrates an example cross-section of the seat pad 300. As shown, the seat pad 300 includes a first foam substrate 402 and a second foam substrate 404. The thermal generating devices 200 can be disposed between the foam substrates 402, 404. As shown, the foam substrates 402, 404 include thermoconductive channels 406, 408 disposed therein. The thermoconductive channels 406, 408 are formed from suitable thermoconductive materials that allow for the transfer of heat or cold. For example, the thermoconductive channels 406, 408 may be formed from metal foam. In another example, the thermoconductive channels 406, 408 are holes defined within the foam substrates 402, 404.

The thermal generating devices 200 are positioned between the foam substrates 402, 404 such that the thermal generating devices 200 are in contact with corresponding thermoconductive channels 406, 408. The thermal generating devices 200 may be disposed within a foam substrate 410 that maintains a thermal generating device 200 in position with respect to other thermal generating devices 200 within the foam substrate 410.

The seat pad 300 can also include a heat sink 412 disposed along a bottom side (side opposite of the side in contact with the thermal generating devices 200) of the foam substrate 404. The heat sink 412 may be formed from a suitable thermos-conductive foam materials. The heat sink 412 can absorb heat generated by the thermal generating devices 200 and transfer the absorbed heat to a fluid medium, such as air.

Figure 5:
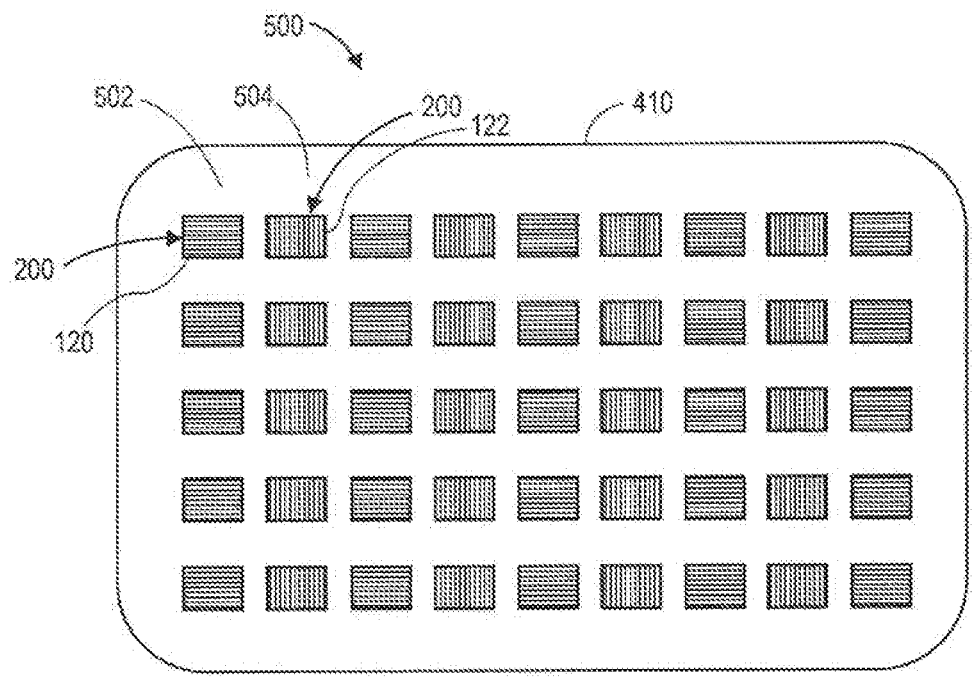
FIG. 5 is a plan view of an example of multiple thermal generating devices disposed in a foam substrate according to the present disclosure.
Figure 6:
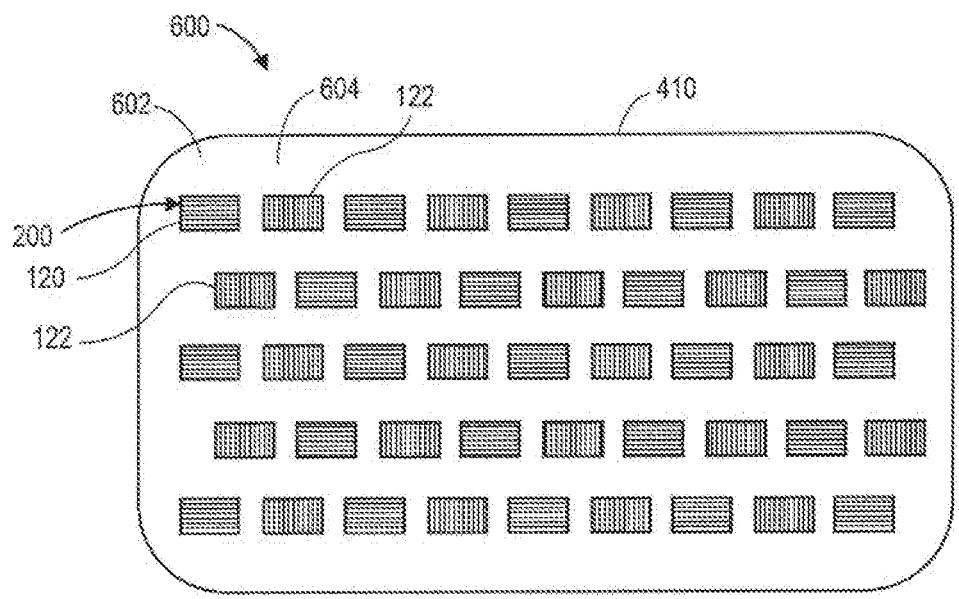
FIG. 6 is another plan view of an example of multiple thermal generating devices disposed in a foam substrate according to the present disclosure.
Figure 7:
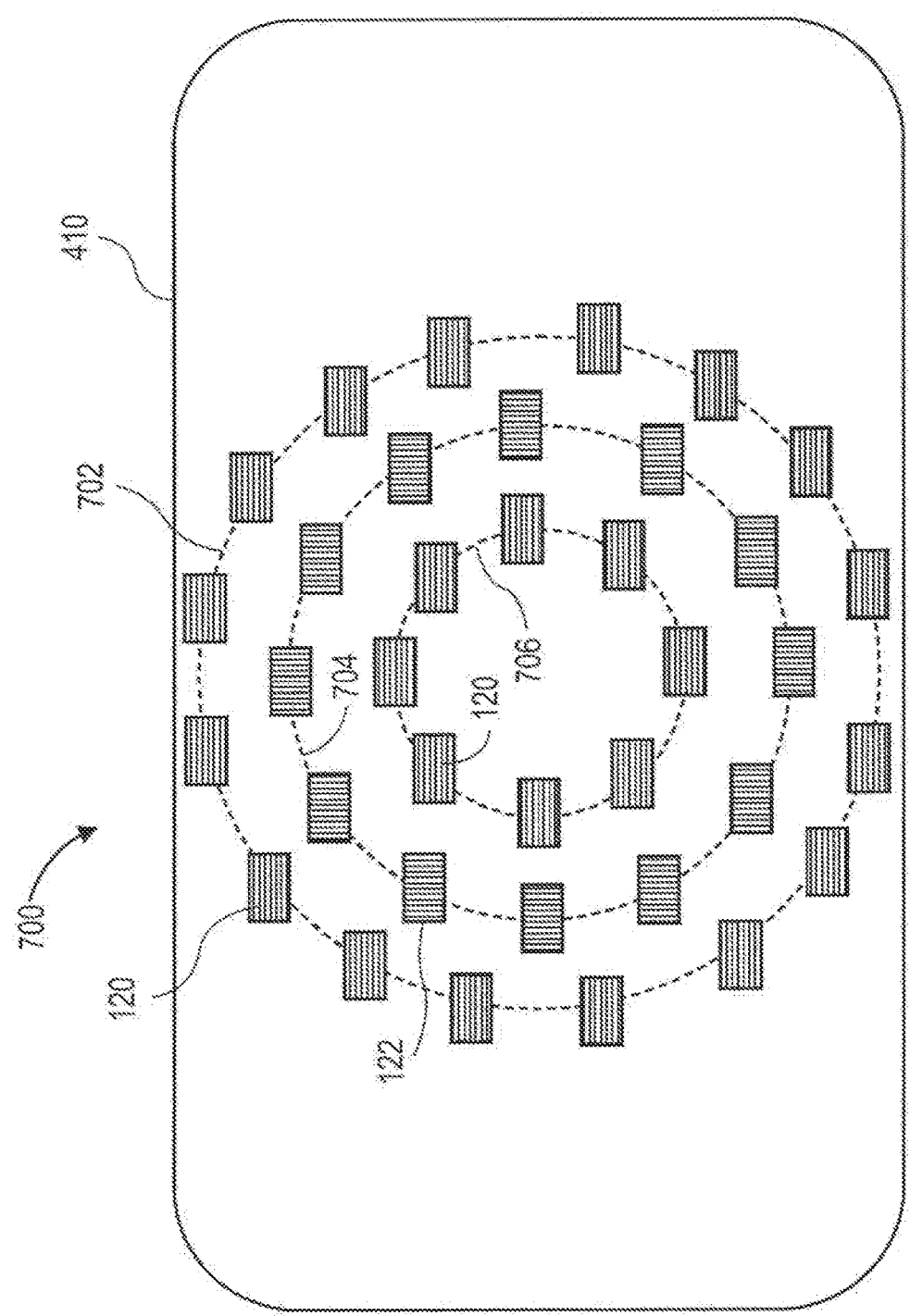
FIG. 7 is another plan view of an example of multiple thermal generating devices disposed in a foam substrate according to the present disclosure.

FIGS. 5 through 7 illustrate plan views of example arrangements of thermal generating devices 200 positioned within the foam substrate 410. As shown in FIG. 5, the plan view 500 illustrates that the foam substrate 410 includes a first column 502 and a second column 504 of thermal generating devices 200. The first column 502 includes thermal generating devices 200 having the first ceramic structure 120 oriented along a top surface 506 of the foam substrate 410. The second column 504 includes thermal generating devices 200 having the second ceramic structure 122 oriented along the top surface 506 of the foam substrate 410.

The first ceramic structure 120 corresponds to the heating side of the thermal generating device 200, and the second ceramic structure 122 corresponds to the cooling side of the thermal generating device 200. As shown in FIG. 5, each thermal generating device 200 in the first column 502 is parallel to the other thermal generating devices 200 in the first column 502, and each thermal generating device 200 in the second column 504 is parallel to the other thermal generating devices 200 in the second column 504.

FIG. 6 is a plan view 600 illustrating that the foam substrate 410 includes a first column 602 and a second column 604 of thermal generating devices 200. The columns 602, 604 include thermal generating devices 200 having alternating ceramic structures 120, 122 oriented along a top surface 606 of the foam substrate 410.

As shown in FIG. 6, each thermal generating device 200 in the first column 602 is offset, or staggered, with respect to the other thermal generating devices 200 in the first column 602, and each thermal generating device 200 in the second column 604 is offset, or staggered, with respect to the other thermal generating devices 200 in the second column 604.

FIG. 7 is a plan view 700 illustrating that the foam substrate 410 includes multiple thermal generating devices 200 arranged in a circular pattern. In an implementation, thermal generating devices 200 having the first ceramic structure 120 are arranged in a first circular arrangement 702, and thermal generating devices 200 having the second ceramic structure 122 are arranged in a second circular arrangement 704 within the first circular arrangement 702. Additionally, thermal generating devices 200 having the first ceramic structure 120 are arranged in a third circular arrangement 706 within the second circular arrangement 704.

Figure 8B:
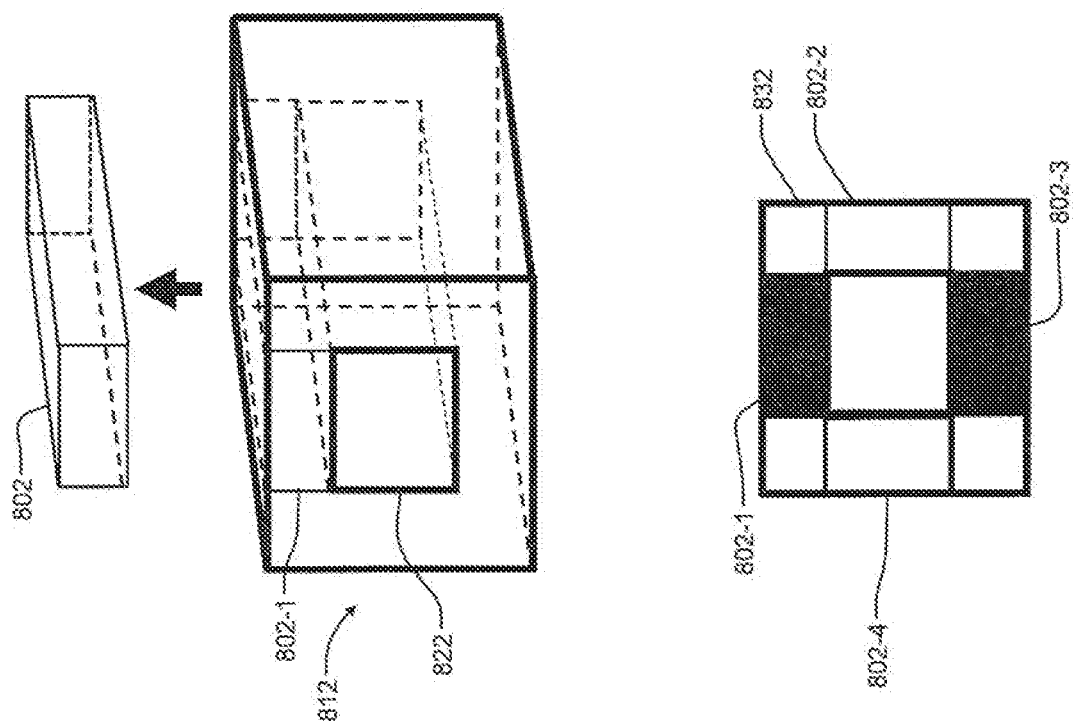
FIGS. 8A and 8B are isometric illustrations of examples of thermal generating device holders according to the present disclosure.
Figure 8A:
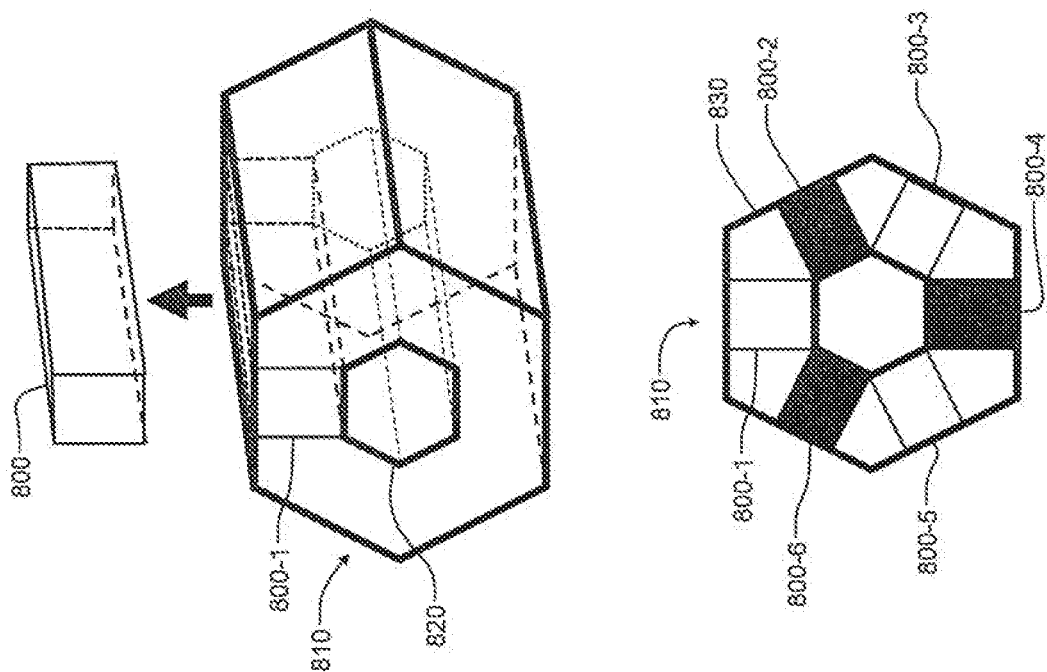
Figure 9:
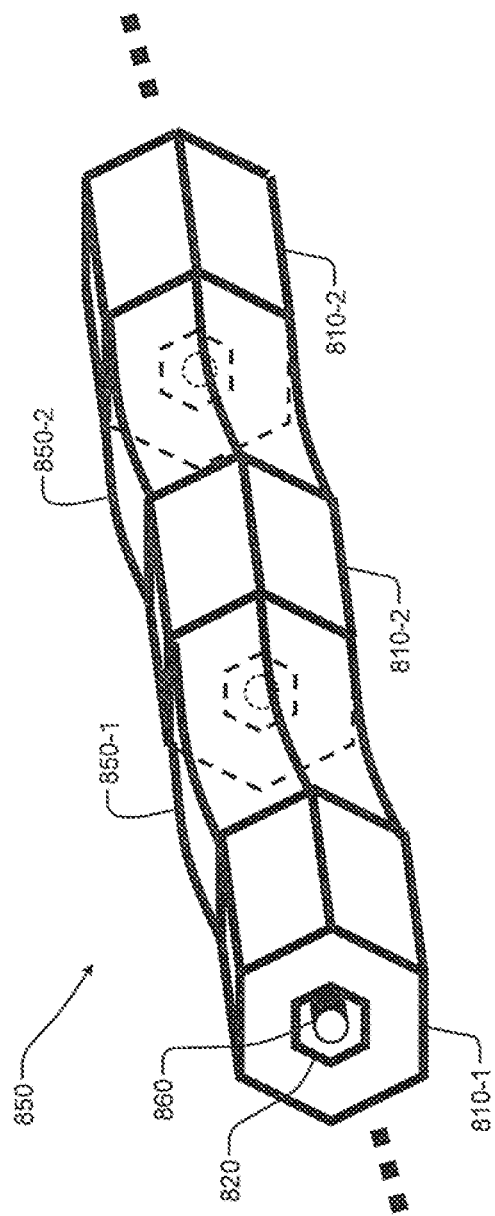
FIG. 9 is an isometric illustration of an example of thermal generating device holders connected together using a string according to the present disclosure.

FIGS. 8A, 8B and 9 illustrate thermal generating device holders 810, 812 each including thermoelectric cooler/heater devices 800, 802, respectively. In some examples, the thermal generating device holders 810, 812 may be formed from aluminum, copper, or the like, although other materials may be used.

The thermal generating device holders 810, 812 include central cavities 820, 822 extending through a middle portion of the thermal generating device holders 810, 812, respectively. Each lateral face 814, 816 of the thermal generating device holders 810, 812 includes one of the thermoelectric cooler/heater devices 800, 802, respectively. In some examples, the thermal generating device holders 810, 812 have N lateral faces and N thermoelectric cooler/heater devices 800-1, 800-2, . . . , and 800-N. For example in FIG. 8A, N=6. In FIG. 8B, N=4. In some examples, the exposed surfaces of the N thermoelectric cooler/heater devices 800-1, 800-2, . . . , and 800-N alternate around a periphery of the thermal generating device holders 810, 812 to provide heating or cooling. While hexagonal and rectangular shapes are shown, other polygonal or non-polygonal shapes can be used. In some examples, electrical connections (not shown) may be made inside the central cavities 820, 822 or externally therefrom.

In FIG. 9, a thermal generating device 850 includes a plurality of the thermal generating device holders 810 that are connected together as shown using a string 860 such as yarn, thread, or other material. In some examples, the thermal generating device holders 810 are connected immediately adjacent to one another. In other examples, spacers 850-1, 850-2, . . . may be used between the thermal generating device holders 810. In some examples, the spacers 850-1, 850-2, . . . are made of a flexible material such as plastic, rubber or another material to increase flexibility.

Figure 10:
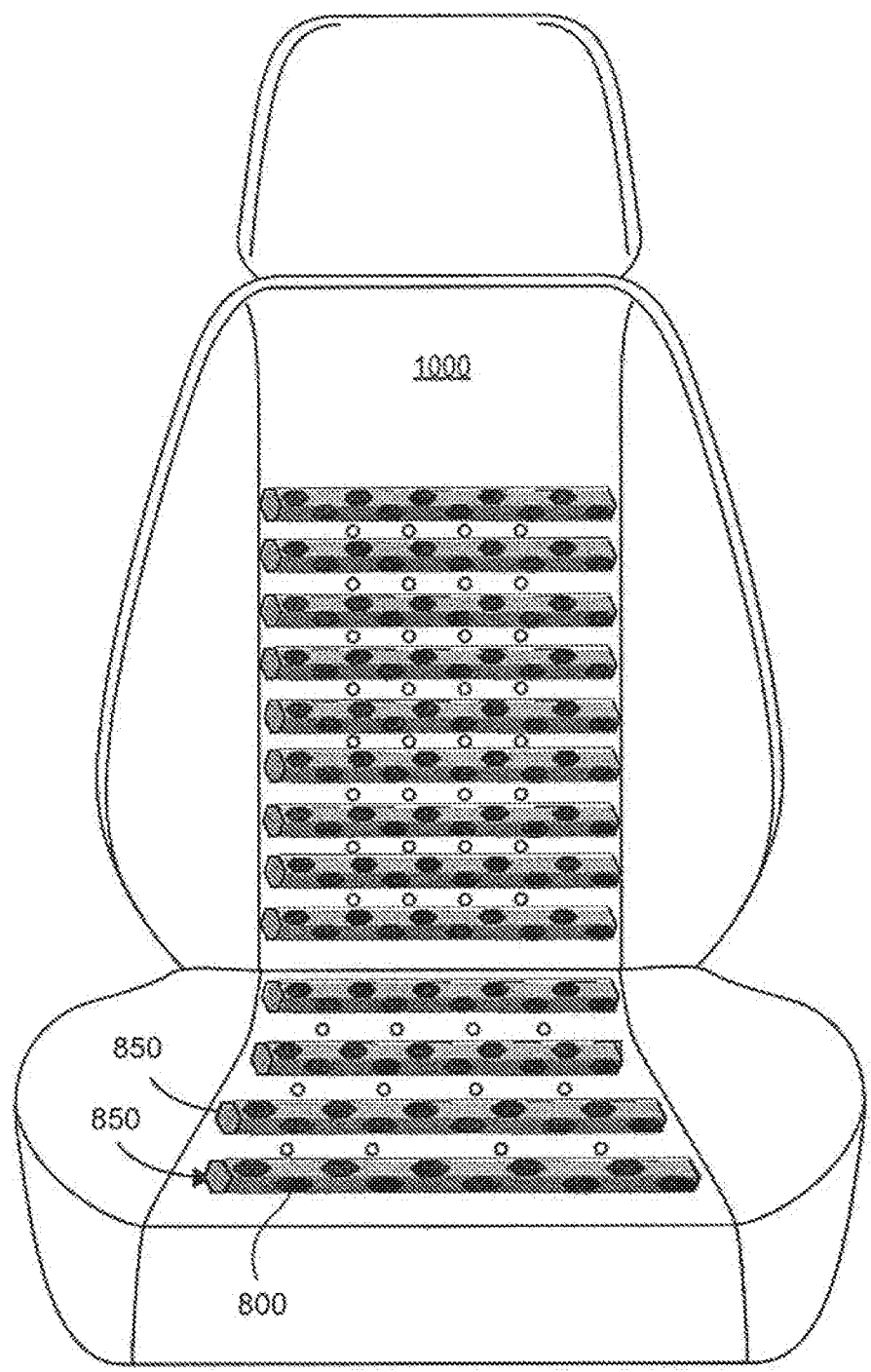
FIG. 10 is a diagrammatic illustration of an example of a seat including multiple thermal generating devices according to the present disclosure.

FIG. 10 illustrates an example seat 1000 that includes thermal generating devices 850. In an implementation, the thermal generating devices 850 are attached to the seat 1000. For example, the thermal generating devices 850 are stitched or otherwise attached to the seat 1000 during construction of the seat 1000.

It is understood that the thermal generating devices described herein may also be used as thermoelectric generators. For example, the thermoelectric devices can be used for energy harvesting during times when the thermal generating devices are not used to thermally adjust the seat and/or seat pad.

Figure 11:
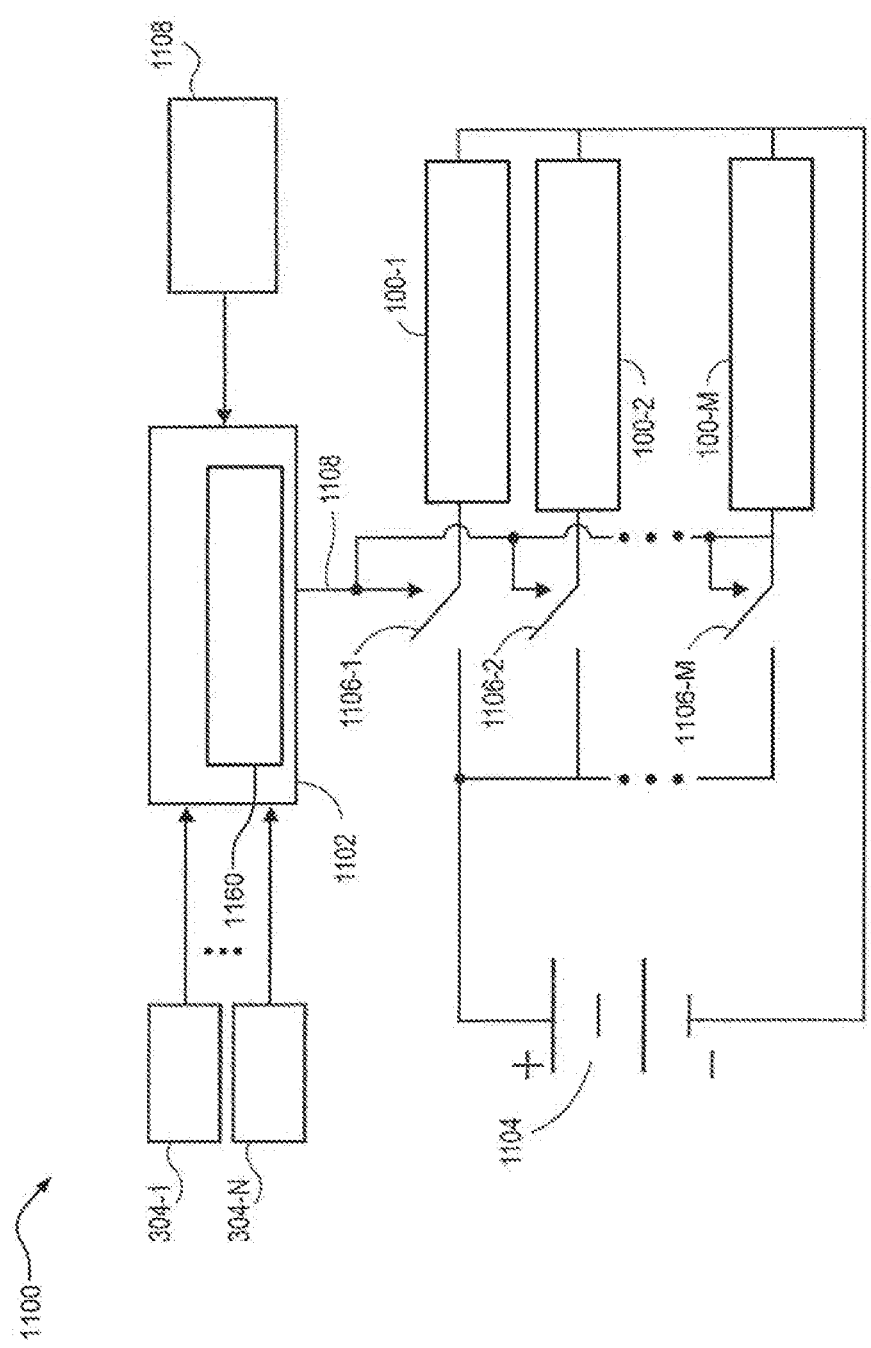
FIG. 11 is a schematic of an example system for providing localized heating and cooling using one or more thermoelectric cooler/heater devices according to the present disclosure.

FIG. 11 illustrates an example control system 1100 for controlling localized heating and/or cooling to a seat pad and/or a seat. The control system 1100 includes a controller 1102, a power source 1104, switches 1106-1 through 1106-M, thermoelectric cooler/heater devices 100-1 through 100-M, and sensors 304-1 through 304-N, where M and N are integers equal to or greater than 1. The controller 1102 is connected to the switches 1106-1 through 1106-M via a bus 1108. The thermoelectric cooler/heater devices 100-1 through 100-M may be disposed within the seat pad and/or the seat according to the implementations described above. The controller 1102 implements a cooling and heating profile 1160 that defines temperature differences between thermoelectric heaters/coolers or groups of thermoelectric heaters/coolers. The temperature differences can be set by a user and/or pre-stored. For example only, the temperature differences may be used to provide more heat in some locations such as edges of seat cushions and less heat in other locations such as centers of seat cushions.

The controller 1102 may be preprogrammed with instructions to generate control signals based on the received input. The control signals can cause one or more switches 1106-1 through 1106-M to transition from an open state to a closed state to connect corresponding thermoelectric cooler/heater devices 100-1 through 100-M to the power source 1104. In various implementations, the controller 1102 can activate individual thermoelectric cooler/heater devices 100-1 through 100-M or a subset of thermoelectric cooler/heater devices 100-1 through 100-M based on one or more input parameters.

The controller 1102 may access a look-up table to determine whether to connect one or more thermoelectric cooler/heater devices 100-1 through 100-M to the power source 1104 via the one or more switches 1106-1 through 1106-N based on the received input. In an implementation, the look-up table can store the detected input parameters (e.g., humidity, temperature, etc.) and corresponding switch control signals as a key-value pair.

In another implementation, the controller 1102 can receive input from an occupant via a user interface. For example, the input from the occupant may represent a drive time corresponding to a driving trip, an occupant-defined pattern preference, or the like. Based on the input, the controller 1102 determines the corresponding switch control signals via the look-up table.

Based on the control signals, a predefined number of thermoelectric cooler/heater devices 100-1 through 100-M may generate thermal energy to provide thermal comfort to the occupant of the seat pad and/or seat. In an implementation, a predefined subset (e.g., pattern) of thermoelectric cooler/heater devices 100-1 through 100-M may be connected to the power source 1104 to generate thermal energy. For example, a subset of thermoelectric cooler/heater devices 100-1 through 100-M that corresponding to a specific area of the occupant's body (e.g., back, neck, etc.) may be connected to the power source 1104 to generate thermal energy.

Figure 12:
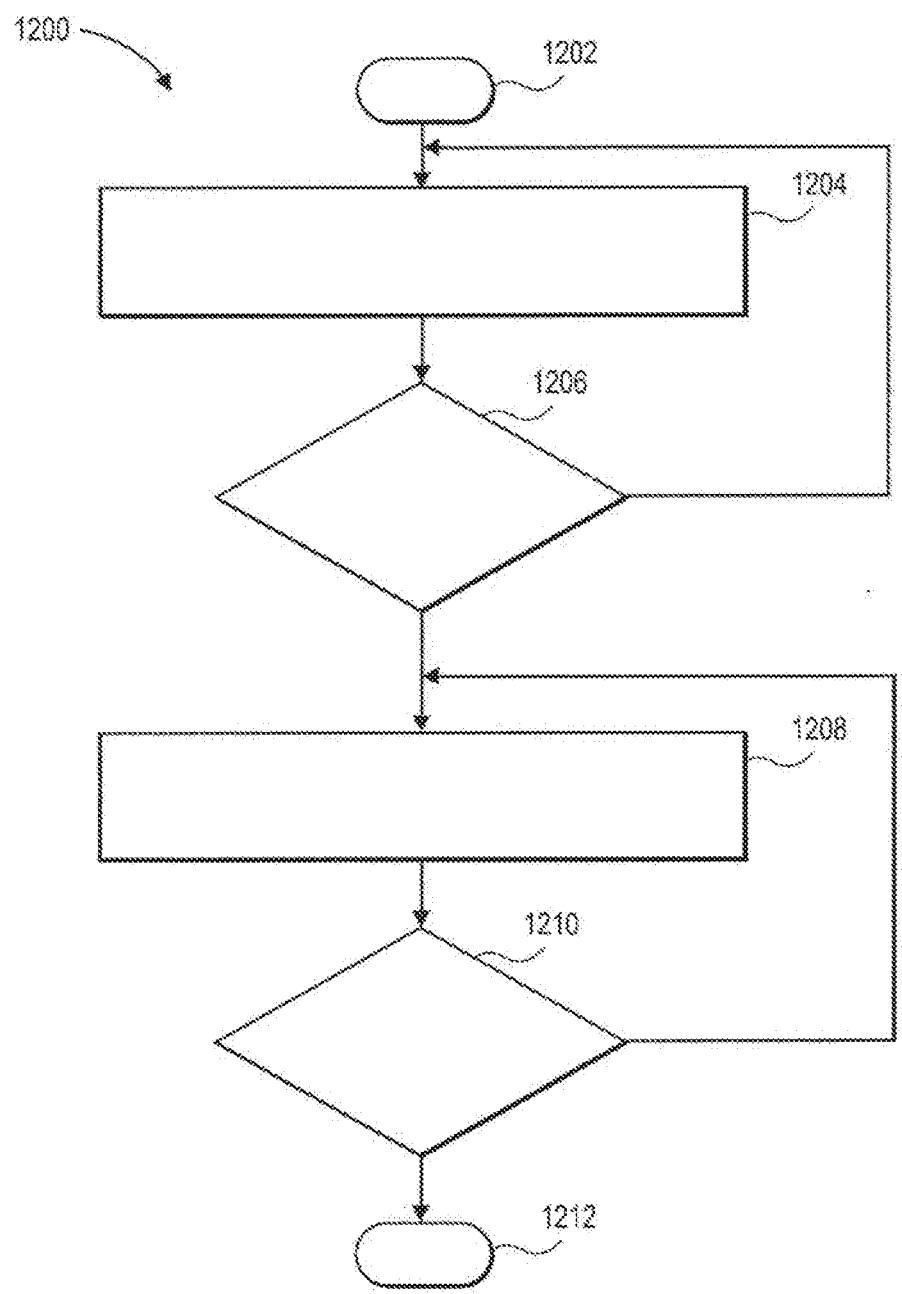
FIG. 12 is a flow diagram illustrating an example method of providing localized heating and cooling using one or more thermoelectric cooler/heater devices.

FIG. 12 illustrates an example method 1200 for providing localized heating and/or cooling to the seat pad and/or the seat. The method 1200 begins at 1202. At 1204, an input indicative of temperature and/or humidity is received at one or more sensors 304-1 through 304-M. At 1204, the controller 1102 determines whether to activate the thermoelectric cooler/heater devices based on the input. For example, the controller 1102 accesses the look-up table and compares the received input to the look-up table keys to generate a control signal for localized heating and/or cooling within the seat pad and/or the seat based on the input. When the received input corresponds to one or more look-up table keys, the controller 1102 retrieves the corresponding values that are indicative of the switches 1106-1 through 1106-M to activate.

If the controller 1102 determines that the thermoelectric cooler/heater devices are not to be activated based on the received input, the method 1200 returns to 1204. Otherwise, the controller 1102 generates control signals to activate the corresponding switches based on the retrieved values at 1208. For example, the controller 1102 generates and transmits the control signals 1102 to the corresponding switches 1106-1 through 1106-M to cause one or more predetermined switches 1106-1 through 1106-M to transition from an open state to a closed state that connects one or more thermoelectric cooler/heater devices 100-1 through 100-M to the power source 1104.

At 1210, the controller 1102 determines whether input to modify the heating/cooling has been received from the user interface 1108. If input to modify the heating/cooling has been received, the controller 1102 activates the switches corresponding to the control signal to activate at least a subset of thermoelectric cooler/heater devices at 1208. The method 1200 ends at 1212.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor substrates, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A thermal control system, comprising:
a component having a surface; and
a plurality of thermal generating devices including:
 a first conductive plate;
 second and third conductive plates;
 a first semiconductor device arranged between the first conductive plate and the second conductive plate; and
 a second semiconductor device arranged between the first conductive plate and the third conductive plate,
 wherein the first semiconductor device and the second semiconductor device have different types of doping,
wherein first ones of the plurality of thermal generating devices are arranged with the first conductive plate located adjacent to the surface of the component,
wherein second ones of the plurality of thermal generating devices are arranged with the second and third conductive plates located adjacent to the surface of the component, and
wherein the first ones and the second ones of the plurality of thermal generating devices perform heating and cooling of the surface, respectively.

2. The thermal control system of claim 1, further comprising:
a plurality of temperature sensors arranged adjacent to the surface to sense a plurality of temperatures of the component; and
a controller configured to selectively operate the plurality of thermal generating devices based on the plurality of temperatures.

3. The thermal control system of claim 1, further comprising a controller including a heating and cooling profile storing temperature differences for the plurality of thermal generating devices attached to the component based on locations of the plurality of thermal generating devices, wherein the controller controls power to the plurality of thermal generating devices based on the heating and cooling profile.

4. The thermal control system of claim 1, wherein one of the first ones of the plurality of thermal generating devices and the second ones of the plurality of thermal generating devices is selectively used to sense a plurality of temperatures.

5. The thermal control system of claim 4, further comprising a controller configured to operate the plurality of thermal generating devices based on the plurality of temperatures.

6. The thermal control system of claim 1, wherein a subset of the plurality of thermal generating devices are arranged in a column.

7. The thermal control system of claim 6, wherein each of the plurality of thermal generating devices that are arranged within the column are arranged parallel to one another.

8. The thermal control system of claim 1, wherein the plurality of thermal generating devices are arranged in a circular arrangement within the at least one of a seat and a seat pad of a vehicle.

9. The thermal control system of claim 1, wherein the first ones and the second ones of the plurality of thermal generating devices are disposed between a first foam substrate and a second foam substrate.

10. The thermal control system of claim 9, wherein the first foam substrate defines a plurality of thermoconductive channels.

11. The thermal control system of claim 9, further comprising a heat sink arranged along a surface of the second foam substrate.

12. A thermal control system, comprising:
a vehicle component selected from a group consisting of a seat, a seat pad and a steering wheel, wherein the vehicle component includes a surface;
a plurality of thermal generating devices including:
  a first conductive plate;
  second and third conductive plates;
  a first semiconductor device arranged between the first conductive plate and the second conductive plate; and
  a second semiconductor device arranged between the first conductive plate and the third conductive plate,
  wherein the first semiconductor device and the second semiconductor device have different types of doping,
wherein first ones of the plurality of thermal generating devices are arranged with the first conductive plate located adjacent to the surface of the component,
wherein second ones of the plurality of thermal generating devices are arranged with the second and third conductive plates located adjacent to the surface of the component, and
wherein the first ones and the second ones of plurality of thermal generating devices perform heating and cooling of the surface, respectively; and
a controller including a heating and cooling profile defining temperature differences for the plurality of thermal generating devices attached to the component based on locations of the plurality of thermal generating devices, wherein the controller controls power to the plurality of thermal generating devices based on the heating and cooling profile.

13. The thermal control system of claim 12, wherein the first ones of the plurality of thermal generating devices sense a plurality of temperatures.

* * * * *